United States Patent [19]

Page

[11] Patent Number: 4,611,222

[45] Date of Patent: Sep. 9, 1986

[54] SOLID-STATE SWITCH

[75] Inventor: Derrick J. Page, Murrysville Boro, Pa.

[73] Assignee: Westinghouse Electric Corp., Pittsburgh, Pa.

[21] Appl. No.: 244,564

[22] Filed: Mar. 17, 1981

Related U.S. Application Data

[63] Continuation of Ser. No. 84,210, Oct. 12, 1979, abandoned.

[51] Int. Cl.⁴ .............................................. H01L 27/14
[52] U.S. Cl. ........................................ 357/30; 357/38; 357/55; 357/56
[58] Field of Search ....................... 357/30, 38, 55, 56

[56] References Cited

U.S. PATENT DOCUMENTS

| | | | |
|---|---|---|---|
| 3,111,590 | 11/1963 | Noyce | 357/55 |
| 3,362,858 | 1/1968 | Knopp | 357/38 |
| 3,644,799 | 2/1972 | Weisshaar | 357/56 |
| 3,919,005 | 11/1975 | Schinella et al. | 357/38 |
| 3,987,476 | 10/1976 | Sittig | 357/30 |
| 4,016,592 | 4/1977 | Yatsuo et al. | 357/38 |

Primary Examiner—Joseph E. Clawson, Jr.
Attorney, Agent, or Firm—C. L. Menzemer

[57] ABSTRACT

The present invention is directed to a four-region solid-state switching device whose topology readily links itself to light activation. Anode and cathode emitter regions of the device are disposed in the same surface of the device. Both base regions are exposed on a mesa portion disposed between the anode and cathode regions. The topology of the device is such that current flows across the device rather than through the device and light is introduced through the base regions perpendicular to the direction of current flow.

6 Claims, 8 Drawing Figures

SOLID-STATE SWITCH

This is a continuation of application Ser. No. 084,210, filed Oct. 12, 1979 now abandoned.

BACKGROUND OF THE INVENTION

1. Field of the Invention:

The present invention is in the field of solid-state, four-region switching devices in general and in particular is directed to a light-activated, four-region, solid-state switching device, of the type known as thyristors, in which the current flows laterally across the device as opposed to vertically through the device.

2. Description of Prior Art:

Light-activated, four-region, solid-state switching devices, thyristors, are well known in the art. Typically, in such devices, current flows vertically through the device and the activating light is introduced parallel to the current flow.

The advantages of introducing light perpendicular to the direction of current flow through the device have been recognized, however, attempts to accomplish this has not produced devices that can be readily produced on a commercial scale with acceptable yields.

Other attempts have been made at introducing light into the thyristor in a direction parallel to the direction of current flow and then causing the light to scatter laterally across the device. This is set forth in U.S. Pat. No. 3,590,344. Such teachings require etching pits in the bottom surface of a silicon wafer and is not satisfactory.

SUMMARY OF THE INVENTION

The present invention is a four-region, solid-state switching device or thyristor comprising a body of semiconductor material, said body having top and bottom opposed major surfaces, anode and cathode emitter regions spaced apart and disposed in said top surface, anode base region and cathode base region exposed on a mesa portion of said top surface, said mesa portion being disposed between said anode and cathode emitter regions.

DESCRIPTION OF THE DRAWINGS

For a better understanding of the nature of the present invention reference should be had to the following detailed description and drawings in which.

DESCRIPTION OF THE PREFERRED EMBODIMENTS

Figure 1:
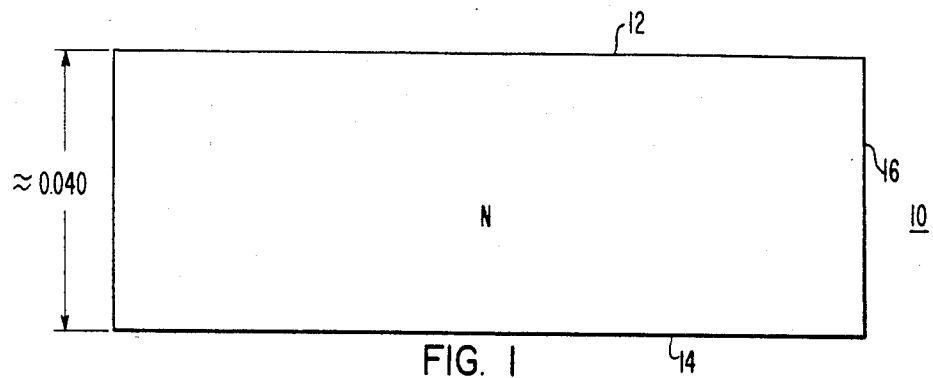
FIG. 1 is a side view of a body of semiconductor material suitable for use in practicing the teachings of this invention.

With reference to FIG. 1, there is shown a body of semiconductor material 10, preferably silicon. For descriptive purposes, the body 10 will be considered to be single-crystal silicon with an n-type conductivity and about 40 mils thick.

The body 10 has spaced-apart major parallel top and bottom surfaces 12 and 14 respectively. An edge portion 16 extends between top surface 12 and bottom surface 14.

Figure 2:
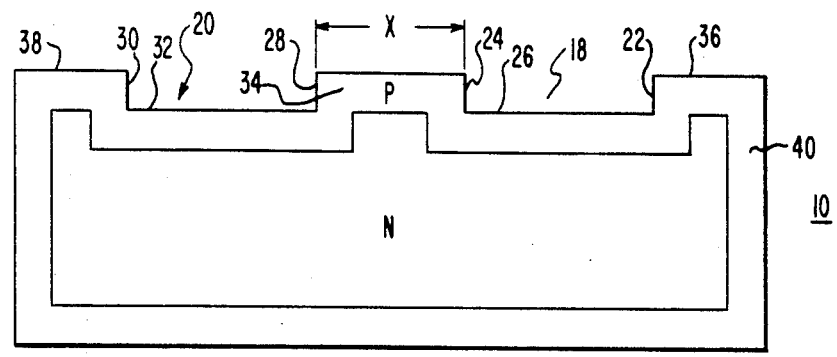
FIGS. 2 and 3 are side views of the body of FIG. 1 being processed in accordance with the teachings of this invention.

With reference to FIG. 2, using known photo-resist masking and etching techniques, two wells 18 and 20 respectively are formed in top surface 12 of the body 10.

The first well 18 has side walls 22 and 24 and a bottom surface 26. The second well 20 has side walls 28 and 30 and a bottom surface 32. A suitable etchant for carrying out this etching is the well-known nitric acid, hydrofluoric acid, acetic acid etchant.

The wells 18 and 20 have a depth of about 5 mils and a width of about 15 mils. The length will depend on current level desired e.g. at $10^4 A/cm^2$ length will be 0.8 cm for 100A.

The formation of wells 18 and 20 result in the formation of a central mesa 34 and two peripheral mesas 36 and 38.

The central mesa 34 has a width, indicated by "X" in FIG. 2, of about 15 mils. The peripheral mesas 36 and 38 have a width of about 100 mils.

The important parameter for determining the width of the wells 18 and 20 and the width of the central mesa 34 is that the width of the resultant device's cathode base region is dependent upon the width of the central mesa.

Following the formation of the wells and mesas a p-type region 40 is formed in the body 10. The region 40 which may be formed by well-known diffusion techniques employing preferably aluminum or gallium as the diffusant, extends entirely around the perimeter of the body 10. The region 40 preferably has a surface dopant concentration of $10^{18}$ atoms/cc and extends into the body to a depth of about 3 mils. The depth of region 40 should be less than the depth of the wells 18 and 20.

The width of the anode base region in the resultant device is determined by this diffusion depth.

Figure 3:
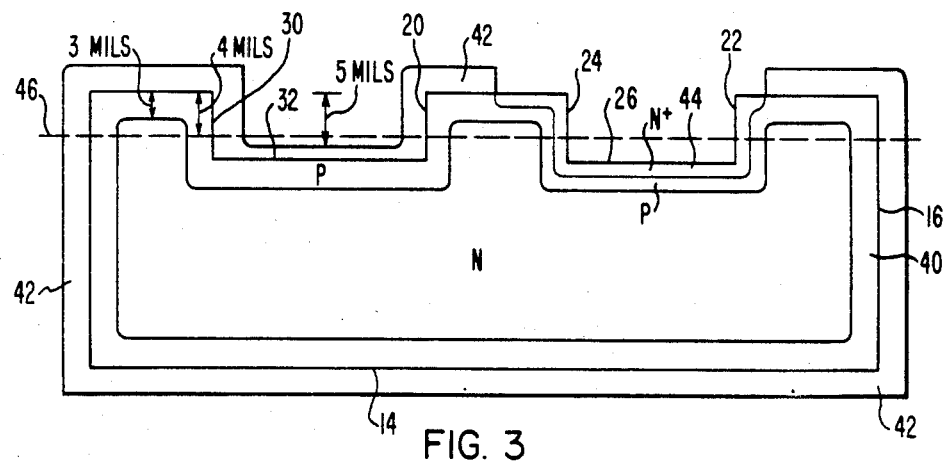

With reference to FIG. 3, a continuous oxide layer 42 is formed on edge portions 16, bottom surface 14 and over a portion of top surface 12 of the body 10. The thickness of the oxide layer 42 is not critical and a thickness of from 200 Å to 500 Å has been found to be satisfactory. The purpose of the oxide layer being to mask the covered portion of the body 10 from a subsequent n-type diffusant.

The portion of the top surface 12 of the body 10 covered by the oxide layer 42 extends from the edge portion 16 of the body to approximately the center of the central mesa 34. The exact amount of the center mesa 34 covered by the oxide layer 42 is not critical, the oxide layer 42 should cover the peripheral mesa 38 and the well 20 and extend onto at least a portion of the central mesa 34. It has been found particularly satisfactory if approximately one-half of the width of central mesa 34 is covered by the oxide layer 42.

A region 44 of n-type conductivity is formed by diffusing a suitable n-type doping material as, for example, phosphorus through that portion of top surface 12 of body 10 not covered by the oxide layer 42.

The region 44 has a depth of about 0.5 mil, the controlling feature being that the underlying p-type region 40 not be destroyed, and is doped to a concentration of, for example, $10^{20}$ atoms/cc. The n-type region 44 is doped to a concentration that is commonly referred to in the art as an n+ region, i.e., a region doped to a concentration of from $10^{18}$ to $5 \times 10^{21}$ atoms/cc.

The body 10 is then lapped and polished to remove that portion of the body 10 above the dashed line, denoted as 46, in FIG. 3.

If the original body 10 had an initial thickness of 40 mils and the regions were formed to the depths specified above, then about 4 mils of the body 10 will be removed by lapping and polishing.

Figure 4:
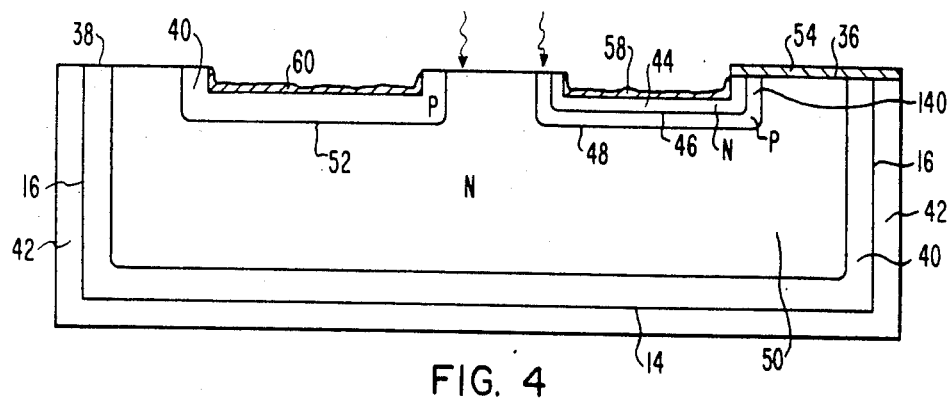
FIG. 4 is a side view of a four-region, solid-state switch prepared in accordance with the teachings of this invention.
Figure 5:
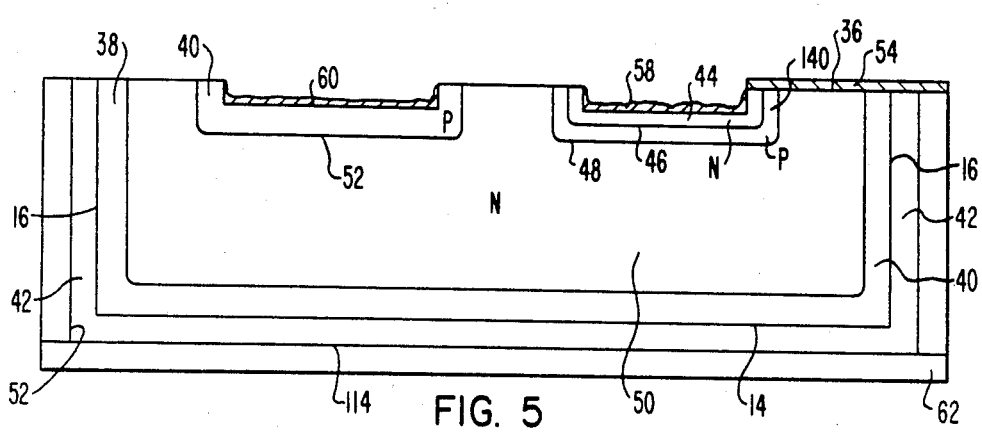
FIG. 5 is a side view of a modified version of the switch of FIG. 4.

With reference to FIG. 4, the result of the lapping and polishing step can be seen.

The original p-type region 40 is now divided into two separate p-type regions 40 and 140. In addition, one end of the original p-type region 40 now terminates in the upper surface of the central mesa 34.

There is a p-n junction 46 between regions 44 and 140, a p-n junction 48 between region 140 and region 50. N-type region 50 is comprised of the remaining portion of the original body 10. A p-n junction 52 exists between region 40 and region 50.

A first electrode 58 and a second electrode 60 are formed by depositing a metal layer on the bottom surface and side walls of the wells 18 and 20. The electrodes 58 and 60 can be comprised of any suitable metal or metal alloy as, for example, aluminum having a thickness of from 10,000 to 20,000 Å.

The resultant semiconductor device shown in FIG. 4 is a four-region switching device. Region 44 functions as a cathode emitter region, region 140 functions as a cathode base region, region 50 functions as an anode base region and region 40 functions as an anode emitter region.

Electrode 58 is the cathode emitter electrode and electrode 60 is the anode emitter electrode.

The semiconductor device of FIG. 4 can be used as a light-activated device, the activating light as, for example, from a laser source is introduced into either or both the anode base region 50 or the cathode base region 140 where the regions terminate at the top surface of the central mesa 34, indicated by the arrows in FIG. 4. In light activated devices some difficulty is experienced in introducing sufficient light into the base regions, in the device of this invention light can be introduced in both base regions thus assuring the introduction of sufficient light. Any light introduced into either emitter region will be neither harmful or useful.

When the device is activated, switched on, by the light, conduction takes between the anode and cathode. That is, the current flows across the device, horizontal flow, rather than through the device, vertical flow.

If the semiconductor device of FIG. 4 is to be a conventional gate-fired, silicon-controlled rectifier, a metallic gate electrode (not shown) can be affixed to either anode gate region 50 or cathode gate region 140 where the regions terminate at the top surface of the central mesa 34 and the remainder of the top surface of central mesa 34 can be passivated with a layer of silicon dioxide.

If latching is a problem during operation of the device or if a device with less bulk is desired, that portion of region 40 extending along the bottom surface 14 of the body 10 can be removed by conventional grinding or lapping.

Figure 6:
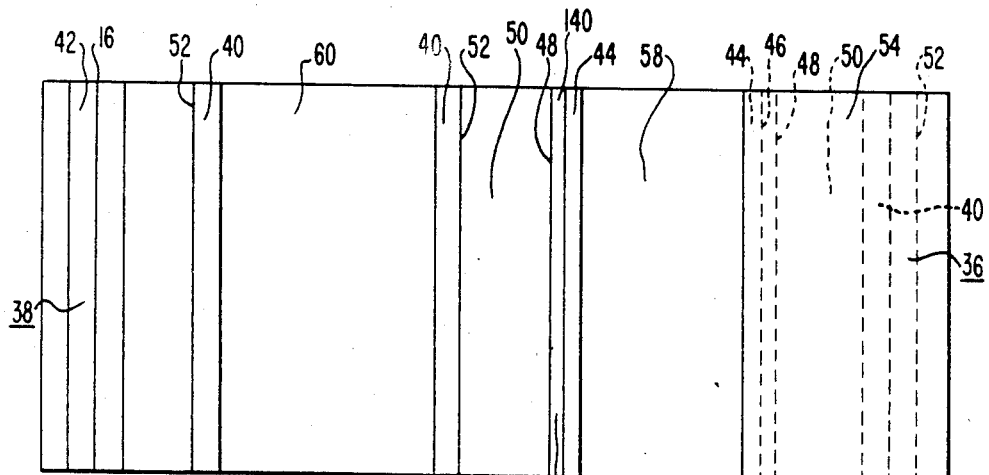
FIG. 6 is a top view of either the device of FIGS. 4 or 5.

With reference to FIG. 6, there is shown a top view of the semiconductor device of FIG. 4. All parts are numbered as in FIG. 4.

Figure 7:
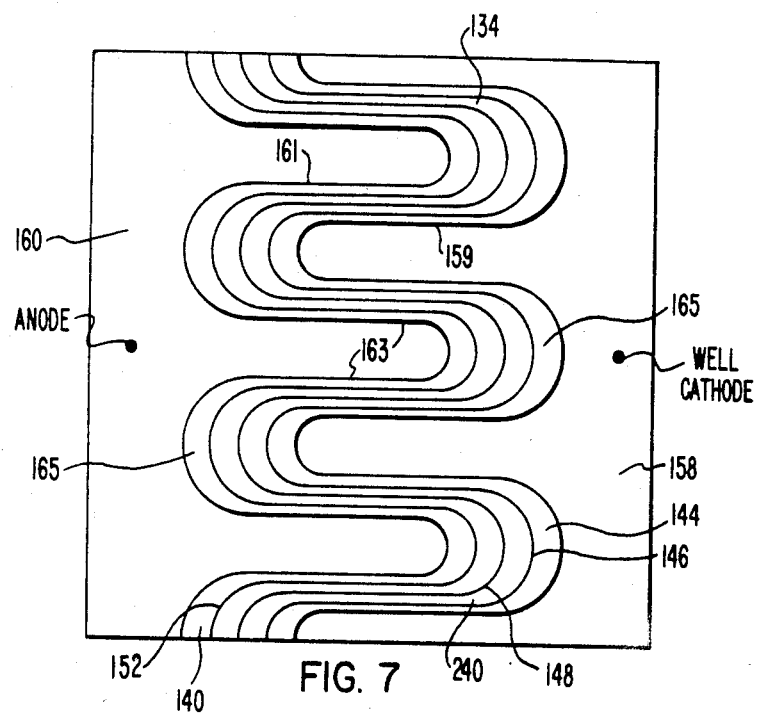
FIG. 7 is a top view of another embodiment of the device of the present invention.
Figure 8:
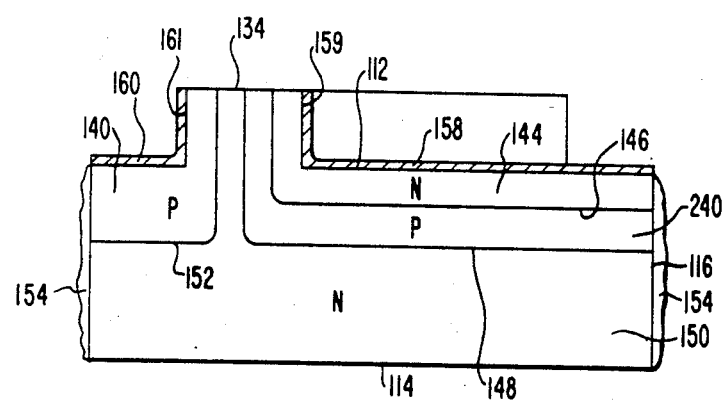
FIG. 8 is a side view of the embodiment of FIG. 7.

With reference to FIGS. 7 and 8, there is shown a top view of a body 110 of semiconductor material in which a thyristor has been built in a modified form from the device set forth and described above in conjunction with FIGS. 1 to 6.

The method of manufacture for the thyristor of FIG. 7 is the same as that set forth above.

Features shown in FIGS. 7 and 8 corresponding to features in FIG. 4 have the same designation numbers with a prefix of 100 or 200 added.

The resultant thyristor structure shown in FIG. 7 is comprised of central mesa 134 of a serpentine configuration. The serpentine configuration provides additional area for the introduction of light to activate the device per total surface area and increases the current carrying capacity of the device.

The structure of FIGS. 7 and 8 does not have the peripheral mesa of FIG. 4. N+-type region 144 and p-type region 240 terminates in the central mesa 134 and in edge portion 116. There is a p-n junction 146 between regions 144 and 240.

P-type region 141, which corresponds to region 40 in FIG. 4, terminates in the central mesa 134, spaced apart from region 240 and in edge portion 116 of the body. N-type region 150 occupies the remainder of the body. There is a p-n junction 148 between regions 150 and 240 and a p-n junction 152 between regions 140 and 150. It is a portion of region 150 that separates regions 140 and 240 in the central mesa 134.

An oxide layer 154 is disposed on edge portion 116 to passivate the p-n junctions 146, 148 and 152 at the point where the junctions intersect the edge portion 116.

The central mesa may be circular in configuration rather than serpentine.

If instead of being serpentine, the central mesa has a circular configuration, there is no need to passivate any end portions.

A first metal electrode 158, for example, aluminum is affixed to region 144 where it is exposed along stop surface 112 and side wall 159 of mesa 134.

A second electrode 160, for example aluminum, is affixed to region 140 where it is exposed along top surface 113 and side wall 161 of mesa 134.

In the structure shown in FIG. 8, any p-type region which may have been formed during the p-type diffusion along bottom surface 114 of the body has been removed as, for example, by grinding and polishing.

The device of FIGS. 7 and 8 is a four-region switch or thyristor. Region 144 functions as cathode emitter, region 240 as cathode base, region 150 as anode base and region 140 as anode emitter.

Electrode 158 functions as cathode emitter electrode and electrode 160 as anode emitter electrode.

The device of FIGS. 7 and 8 can be gated by introducing light as, for example, into either or both of the base regions 150 or 240 as desired where the base regions are exposed at the top surface of the mesa 134.

With reference to FIG. 7, the walls of the mesa in straight portions 163 of the seprentine configuratin are parallel to provide uniform electrical characteristics in the device.

The curved portions 165 of the serpentine configuration are wider by a factor of from 10% to 200% more than the straight portions 163 to prevent premature breakdown due to junction curvature and to prevent current crowding during conduction.

If the straight portion of the serpentine configuration has a width of 5 mils, the curved portion should be approximately 200% wider. If the straight portion has a width of about 20 mils to 30 mils, the curved portion should be approximately 10% wider.

Light-activated four-region switching devices made in accordance with the teaching of this invention and having the configuration set forth hereinabove are capable of operating at high speeds, i.e., a di/dt greater than $10^7$ amps/microseconds and operate at a steady-state current flow of 100 amps/cm$^2$ laterally across the device.

With this di/dt such devices cannot be interconnected by electrically conductive wire because of the resultant parasitic capacitance and inductance.

Rather, devices of the type set forth herein are best utilized when interconnected by strip line having an impedance of one ohm or less.

I claim as my invention:

1. A four-region solid-state switching device comprising, a body of semiconductor material, said body having top and bottom opposed major surfaces, anode and cathode emitter regions spaced apart and disposed in said top surface, anode base region and cathode base region exposed on a mesa portion of said top surface to receive activating light pulses, said mesa portion being disposed between said anode and cathode emitter region and metal electrodes affixed to only said anode emitter region and said cathode emitter region.

2. The four-region solid-state switching device of claim 1 in which the mesa portion of said top surface has a serpentine configration.

3. The four-region solid-state switching device of claim 2 in which straight portions of said serpentine configuration are parallel to each other and curved portions of said serpentine configuration, which connect adjacent straight portions, are wider by a factor of from 10% to 200% than said straight portions.

4. A four-region solid-state switching device comprising, a body of semiconductor material, said body having top and bottom opposed major surfaces, said top surface having a central and peripheral mesa portion, an anode emitter region disposed in said top surface of said body on one side of said central mesa, a cathode emitter region disposed in said top surface of said body on an opposite side of said central mesa from said anode emitter region, anode and cathode base regions exposed on said top surface of said body on said central mesa, said central mesa portion of said top surface having a serpentine configuration, straight portions of said serpentine configuration being parallel to each other and curved portions of said serpentine configuration, which connect adjacent straight portions being wider than said straight portions by a factor of from 10% to 200%, and metal electrodes affixed to only said anode and cathode emitter regions.

5. A four-region solid-state switching device comprising, a body of semiconductor material, said body having major spaced-apart top and bottom surfaces, and an edge portion extending between said top and bottom surfaces, walls of the top surface of the body forming a first and a second well in said top surface of said body, each of said wells having side walls and a bottom surface, said wells defining a central mesa disposed between said wells in said top surface of said body and two separate peripheral mesas in said top surface of said body, said peripheral mesas each extending from said edge portion of said body to one of said wells, said mesas extending in a straight line across the top surface of the body of semiconductor material, a cathode emitter region formed in the side walls and bottom surface of the first well, an anode emitter region formed in the side walls and bottom surface of the second well, a cathode base region adjacent said cathode emitter region and extending from one peripheral mesa to the central mesa, an anode base region adjacent both the cathode base region and the anode emitter region and extending into the central mesa, and electrodes disposed only within each of said wells to facilitate making electrical contact to only each of the emitter regions.

6. A thyristor comprising a body of semiconductor material, said body having major spaced-apart top and bottom surfaces and an edge portion extending between said top and bottom surfaces, walls of the top surface of the body forming a first and a second well in said top surface of said body, each of said wells having side walls and a bottom surface, said wells defining a central mesa disposed between said wells in said top surface of said body and two peripheral mesas in said top surface of said body, said peripheral mesas each extending from said edge portion of said body to one of said wells, a first region of said first-type conductivity, said first region extending from said side walls and bottom surface of said first well a predetermined distance into said body, said first region terminating in the top surface of the body in the central mesa and in the top surface of the body in one peripheral mesa, a second region of a second-type of conductivity extending from said first region a predetermined distance into said body, said second region terminating in the top surface of the body central mesa and in the top surface of the body in said one peripheral mesa, a p-n junction between said first and second regions, a third region, said third region having said second-type conductivity, said third region originating in the top surface of the body in the central mesa portion, spaced apart from said second region in said central mesa portion, extending into the body a predetermined distance under said other well, extending in the body the same predetermined distance under the top surface of the other peripheral mesa, and extending into the body the same predetemrined distance from said edge portion and from said bottom surface of the body and terminating in said one peripheral mesa spaced apart from said second region, a fourth region, said fourth region having said first-type conductivity, said fourth region extending between said second region and said third region throughout the body, and only two metal electrodes, the first metal electrode affixed to the side walls and bottom surface of said first well and the second metal electrode affixed to the side walls and bottom surface of said second well.

* * * * *